United States Patent
Henshaw

(10) Patent No.: US 9,172,341 B2
(45) Date of Patent: Oct. 27, 2015

(54) POWER SUPPLY PRE-DISTORTION

(75) Inventor: Robert Henshaw, Cambourne (GB)

(73) Assignee: SNAPTRACK, INC., San Diego, CA (US)

( * ) Notice: Subject to any disclaimer, the term of this patent is extended or adjusted under 35 U.S.C. 154(b) by 0 days.

(21) Appl. No.: 13/700,233

(22) PCT Filed: May 26, 2011

(86) PCT No.: PCT/EP2011/058689
§ 371 (c)(1),
(2), (4) Date: May 17, 2013

(87) PCT Pub. No.: WO2011/147941
PCT Pub. Date: Dec. 1, 2011

(65) Prior Publication Data
US 2013/0222057 A1 Aug. 29, 2013

(30) Foreign Application Priority Data
May 28, 2010 (GB) .................................. 1009043.9

(51) Int. Cl.
H03G 1/04 (2006.01)
H03F 1/02 (2006.01)
H03F 1/32 (2006.01)
(Continued)

(52) U.S. Cl.
CPC .............. *H03G 1/04* (2013.01); *H03F 1/0222* (2013.01); *H03F 1/3205* (2013.01); *H03F 1/3241* (2013.01); *H03F 1/565* (2013.01); *H03F 3/1935* (2013.01); *H03F 3/245* (2013.01); *H03F 2200/102* (2013.01); *H03F 2200/108* (2013.01); *H03F 2200/387* (2013.01); *H03F 2200/391* (2013.01); *H03F 2200/423* (2013.01); *H03F 2200/451* (2013.01); *H03F 2200/462* (2013.01); *H03F 2200/504* (2013.01); *H03F 2201/3224* (2013.01)

(58) Field of Classification Search
CPC ..................................................... H03F 1/3241
USPC .......................... 330/136, 297, 296, 285, 149
See application file for complete search history.

(56) References Cited

U.S. PATENT DOCUMENTS 6,043,707 A 3/2000 Budnik
6,703,897 B2 * 3/2004 O'Flaherty et al. ........... 330/149
(Continued)

FOREIGN PATENT DOCUMENTS

EP 1672783 A1 6/2006
GB 2398648 A 8/2004
(Continued)

OTHER PUBLICATIONS

Agnes Wittmann-Regis, "International Patent Application Number: PCT/EP2011/058689 International Preliminary Report on Patentability", Dec. 13, 2012, Publisher: PCT, Published in: EP.
(Continued)

*Primary Examiner* — Henry Choe

(57) ABSTRACT

There is disclosed a method of generating a supply voltage (230) for a power amplifier (114) arranged to amplify an input signal (228), comprising: generating (104) a target supply voltage tracking the input signal (228); predistorting (400) the target supply voltage to compensate for effects on a supply voltage in the amplifier (114); and generating (102) the supply voltage for the amplifier (114) in dependence on the predistorted target supply voltage (414).

10 Claims, 5 Drawing Sheets

(51) Int. Cl.
　　*H03F 1/56*　　　(2006.01)
　　*H03F 3/193*　　(2006.01)
　　*H03F 3/24*　　　(2006.01)

(56) References Cited

U.S. PATENT DOCUMENTS

| | | | |
|---|---|---|---|
| 6,788,151 B2* | 9/2004 | Shvarts et al. | 330/297 |
| 7,026,868 B2* | 4/2006 | Robinson et al. | 330/10 |
| 7,474,149 B2* | 1/2009 | Snelgrove et al. | 330/136 |
| 7,583,149 B2* | 9/2009 | Funaki et al. | 330/297 |
| 7,755,429 B2* | 7/2010 | Nguyen et al. | 330/289 |
| 2004/0100323 A1* | 5/2004 | Khanifar et al. | 330/51 |

FOREIGN PATENT DOCUMENTS

| | | |
|---|---|---|
| GB | 2438752 A | 12/2007 |
| JP | 2010045508 A | 8/2008 |

OTHER PUBLICATIONS

Cesari, A. et al.: "A DC-DC converter FPGA driver for Efficiency Enhancement of Wideband RF Power Amplifiers," Industrial Electronics, Jun. 2007, pp. 1639-1644.
International Search Report of International Application No. PCT/EP2011/058689, filed: May 26, 2011.
British Search Report, dated Sep. 23, 2012 of Great Britain Application No. 1009043.9.

* cited by examiner

POWER SUPPLY PRE-DISTORTION

BACKGROUND TO THE INVENTION

1. Field of the Invention

The present invention relates to envelope tracking power supplies, and particularly but not exclusively to envelope tracking power supplies for radio frequency (RF) amplifiers.

2. Description of the Related Art

Envelope tracking power supplies are well-known in the art. The principle behind such power supplies is that the supply voltage delivered to an amplifier tracks the input signal to be amplified by the amplifier, such that the supply voltage is at a level sufficient to amplify the instantaneous input signal. In this way, the power supply to the power amplifier does not need to be maintained at a level which corresponds to the peak input signal, but can track the input signal to provide an efficient supply voltage which improves the overall efficiency of the amplifier. A particularly advantageous technique for providing an envelope tracking voltage supply is disclosed by Nujira Limited in UK Patent No. 2398648.

Power amplifiers, such as RF power amplifiers, require a network through which the DC supply voltage is fed to the active element of the amplifier. In a simple arrangement this may comprise an inductor, choke, or other passive network, which is designed to provide a low impedance at DC but which represents a high impedance at the RF operating frequency. Alternatively, the supply feed network may also form part of the RF matching network at the amplifier output.

Prior art techniques implemented in efficient envelope tracking power supplies are adapted to minimise the misalignment of the power supply delivered to the amplifier and the input signal to be amplified, with the intention that the instantaneous voltage supply is based on the instantaneous input signal to be amplified.

However, the presence of the supply feed network causes errors in the supply voltage presented to the active device of the amplifier itself. Thus whilst the voltage supply delivered to a terminal or node of the amplifier may be correctly aligned with the input signal to be amplified, the supply feed network results in this signal being misaligned at the point it is delivered to the active device of the amplifier. These errors become more pronounced as the supply feed inductance increases. At each instant in time, the active device is thus not working at its intended operating point and this degrades the RF output spectrum and other metrics of transmission quality.

It is an aim of the invention to provide an improvement in an envelope tracking power supply, which addresses the above-stated problem.

SUMMARY OF THE INVENTION

In accordance with the invention there is provided a technique for pre-distorting the supply voltage fed to the RF amplifier, so that the active device itself of the RF amplifier receives the correctly aligned supply voltage at each time instant. This ensures the RF amplifier always operates with the correct degree of compression which, for mobile handset implementations in particular, gives constant RF gain irrespective of RF output power.

Simulations and measurements have shown the invention gives a beneficial improvement in RF output spectrum.

In one aspect the invention provides a method of generating a supply voltage for a power amplifier arranged to amplify an input signal, comprising: generating a target supply voltage tracking the input signal; pre-distorting the target supply voltage to compensate for effects on a supply voltage in the amplifier; and generating the supply voltage for the amplifier in dependence on the pre-distorted target supply voltage.

The step of pre-distorting may comprise applying the inverse effect of the effect on the supply voltage in the amplifier.

The step of pre-distorting may compensate for the effects applied to the supply voltage between an input terminal of the amplifier and a node of an active element of the amplifier to which the modulated supply voltage is applied.

The step of pre-distorting may compensate for the effects of a supply feed inductance.

The step of pre-distorting may compensate for the effects of at least one capacitor in the supply feed network of the amplifier.

The step of pre-distorting may compensate for shunt capacitance presented by the active element of the amplifier.

The step of pre-distorting may include estimating the current flowing in the active element of the amplifier.

The step of estimating the current flowing in the active element of the amplifier may comprise modelling the active element as a variable resistor, and mapping a non-linear relationship between resistor values for the variable resistor and the supply voltage at the active element, and estimating the current by dividing the target supply voltage by the resistor value associated with a supply voltage at the active element corresponding to that target supply voltage.

The step of generating the target supply voltage may comprise generating an envelope signal representing the envelope of the signal to be amplified.

The step of generating the target supply voltage may comprise shaping the generated envelope signal. Shaping may be a non-linear mapping between the RF signal envelope or power, and the power amplifier voltage.

The step of generating the target supply voltage may comprise modulating the generated envelope signal.

The step of generating the supply voltage may comprise modulating the pre-distorted target supply voltage.

In another aspect the supply voltage stage for a power amplifier arranged to amplify an input signal, comprising: a tracking voltage generator for generating a target supply voltage tracking the input signal; a pre-distortion stage for pre-distorting the target supply voltage to compensate for effects on a supply voltage in the amplifier; and a supply voltage generator for generating the supply voltage for the amplifier in dependence on the pre-distorted target supply voltage.

The supply voltage for the amplifier may be connected at a supply voltage terminal of the amplifier, the pre-distortion stage being configured to compensate for any effect on the supply voltage in the amplifier path between the supply voltage terminal and an active element of the amplifier which provides the amplification of the input signal.

The active element may be a transistor, and the amplifier path is between the supply voltage terminal of the amplifier and a supply mode of the transistor.

The amplifier path may attenuate or delay the supply voltage delivered to the active element.

BRIEF DESCRIPTION OF THE FIGURES

The invention is now described by way of example with reference to the accompanying figures, in which.

DESCRIPTION OF THE PREFERRED EMBODIMENTS

The invention is described herein by way of particular examples and specifically with reference to preferred embodiments. It will be understood by one skilled in the art that the invention is not limited to the details of the specific embodiments given herein. In particular the invention is described herein by way of reference to an RF amplification stage. However more generally the invention may apply to any arrangement where it is necessary to provide a tracked power supply for an amplification stage. The invention is described herein as particularly advantageous when applied to an RF amplification stage of a portable device, such as a portable device including telephone functionality, such as a mobile telephone handset.

Figure 1:
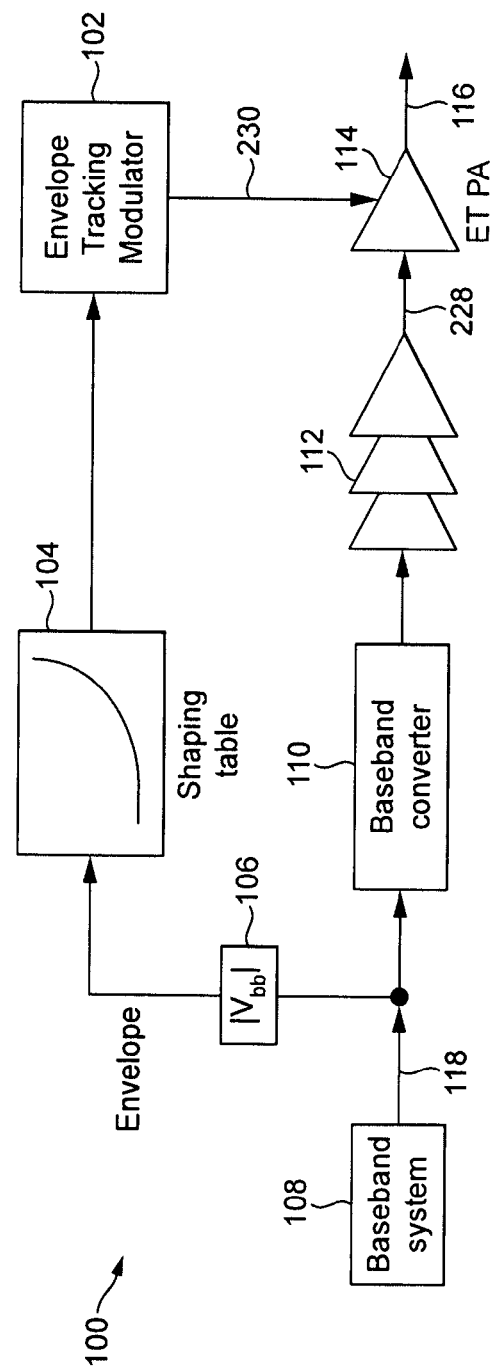
FIG. 1 illustrates an exemplary implementation of an envelope tracking power supply for a power amplifier in accordance with the prior art.

With reference to FIG. 1, there is illustrated an exemplary arrangement of a power amplifier provided with an envelope tracking power supply. The arrangement 100 includes a baseband system 108, an envelope detector 106, a shaping table or function 104, an envelope tracking modulator 102, a baseband converter 110, one or more pre-amplifier stages 112, and an output envelope tracking power amplifier 114.

The baseband system 108 generates a complex I-Q source waveform on a line 118. This waveform is provided as an input to the baseband converter 110. The baseband converter 110 converts the signal provided by the baseband system 108 to a signal for amplification by the RF amplifier. The baseband converter may comprise an RF modulator, an RF up-converter, or a vector modulator for example. The baseband converter modulates the baseband I-Q waveforms onto an RF carrier as known in the art. The output of the baseband converter 110 is provided as an input to the one or more pre-amplifier stages 112, which boost the RF signal to the required transmit output power. The output of the amplification stages 112 on line 228 forms an input to the power amplifier 114, which itself comprises one or more power amplification stages.

The power supply to the power amplifier 114 is delivered on a line 230 from the envelope tracking modulator 102, and is a power supply voltage which tracks the envelope of the input signal to be amplified on line 228. The invention is not limited to any particular implementation of an envelope tracking modulator. Envelope tracking modulators for providing a modulated power supply are well-known in the art.

The envelope tracking is provided by providing the baseband I-Q data on line 118 to the envelope detector 106. The envelope detector includes a magnitude calculation function which derives the baseband envelope signal. Various techniques for implementing an envelope detector are known in the art.

The thus derived envelope signal is fed into the shaping function 104, which preferably comprises a shaping table, for mapping the baseband signal to an amplifier supply voltage. The shaping table of the shaping function 104 is normally a mathematical equation or a look-up table, possibly including an interpolation. The shaping function provides shaping which is a mapping between the RF signal envelope or power, and the power amplifier voltage, which mapping may typically be a non-linear mapping.

The shaped envelope at the output of the shaping function 104 is provided as an input to the envelope tracking modulator 102, which provides the modulated tracking supply voltage on line 230 to the power amplifier 114.

In the examples described herein, it is assumed that the power amplifier 114 is the only amplification stage which is subject to envelope modulation. However one skilled in the art will appreciate how the principles of the invention as described herein may be extended to other arrangements in which a modulated power supply is delivered to more than one output stage amplifier.

Figure 2A:
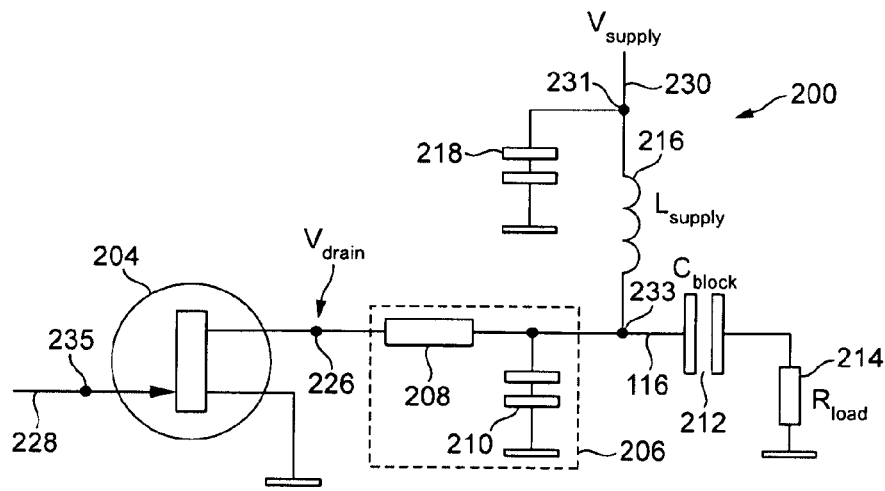
FIGS. 2a and 2b illustrate exemplary simplified models of an RF amplifier output.
Figure 2B:
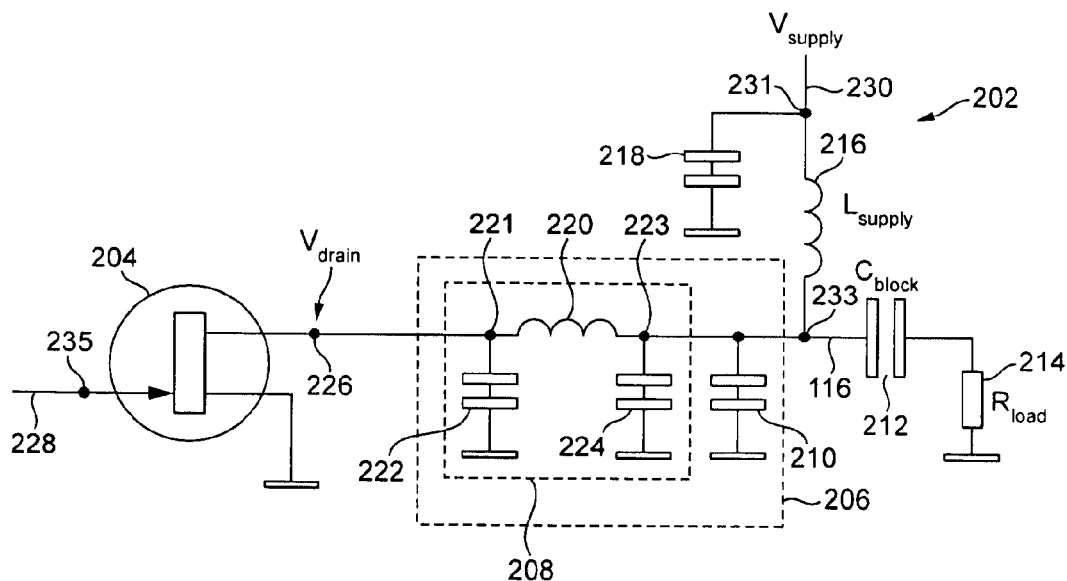

With reference to FIGS. 2*a* and 2*b*, there are illustrated two alternative models of an exemplary amplifier, such as the RF power amplifier 114.

With reference to FIG. 2*a*, there is illustrated a first model 200. The model 200 includes a transistor 204 which is the active element of the power amplifier. The transistor 204 receives as an input, at an input terminal or node 235 of the amplifier, the input signal to be amplified on line 228. The tracked supply voltage is provided on line 230 to a power supply terminal or node 231 of the amplifier. The output of the amplifier is provided on line 116 at an output terminal or node 233 of the amplifier.

A node 226 represents the terminal of the transistor 204 at which the supply voltage, $V_{drain}$, is applied to the active element of the amplifier.

Where elements shown in different Figures correspond to elements shown in other Figures, like reference numerals are used.

The model 200 of FIG. 2*a* additionally includes a capacitor 218 connected between the node 230 and electrical ground, an inductor 216 connected between nodes 231 and 233, a capacitor 212 having a connection at node 233, a matching network 206 connected between the nodes 226 and 233 including a transmission line 208 and a capacitor 210, and a load 214 connected between the capacitor 212 and electrical ground.

A typical RF amplifier output stage, such as that modelled in FIG. 2*a*, may be utilised in a mobile communications application, the frequencies of which are in the band 700 MHz to 2.6 GHz. The impedance of the load 214, which may be of the order of 50 Ohms, is transformed by a number of passive components to an impedance value required by the active element 204. In the example illustrated the active element 204 is a GaAsFET transistor. The matching network 206 in the example of FIG. 2*a* includes the shunt capacitor 210 and the short series transmission line 208. The supply voltage at node 231 on line 230 is delivered to the amplifier via the series inductor 216.

The inductor 216 is a supply feed inductor and, in general, forms part of the amplifier. One approach involves feeding in the supply voltage through a supply feed inductor which is chosen to have a value to present a high impedance at the RF operating frequency, but which is low impedance at the baseband envelope frequencies. An alternative approach involves making the supply feed inductor part of the RF matching network, which transforms the RF load (e.g. 50 Ohms) to the correct impedance for the active element.

FIG. 2*b* shows an alternative model 202. In the alternative of FIG. 2*b*, the short transmission line 208 of the matching network 206 of FIG. 2*a* is implemented by its lumped element equivalent. Thus in FIG. 2*b* a matching network 208 includes an inductor 220 connected between nodes 221 and 223 which connect to nodes 236 and 233 respectively. The matching network 208 further includes capacitors 222 and 224 respectively connected between nodes 221 and 223 and electrical ground.

Figure 3A:
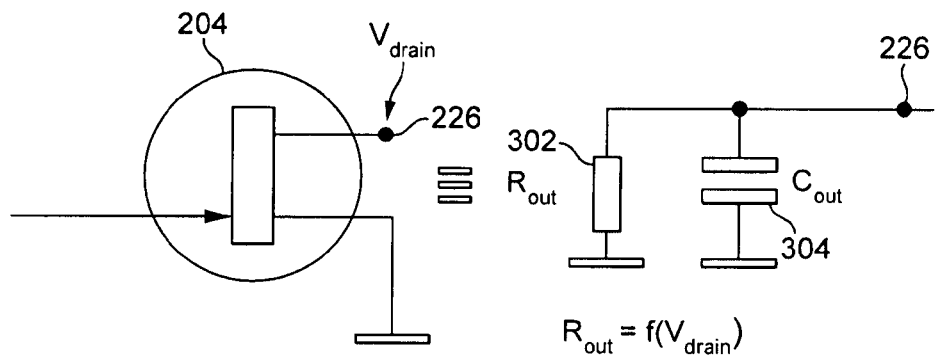
FIGS. 3*a* and 3*b* illustrate exemplary output models of a transistor of a power amplifier.

At baseband frequencies (approximately 0-30 MHz), rather than the RF operating frequencies, the impedance 'looking into' the active device 204 at its output terminal 226 can be modelled as a shunt resistance and a capacitance as illustrated in FIG. 3a. FIG. 3a represents a simple two-element model of the baseband impedance looking into the active devices. Such a simple two-element model is shown and described herein for the purpose of providing a simple example to help understand the principles of the invention. One skilled in the art will appreciate that different models may be utilised, and in particular more complex models may be utilised. The resistor/capacitor model of FIG. 3a is a simple, illustrative example.

As illustrated in FIG. 3a, the transistor 204 is equivalent to a parallel resistor 302 and capacitor 304 arrangement. One terminal of each of the capacitor 304 and resistor 302 is connected to electrical ground, and the other terminals are connected to node 226.

Figure 3B:
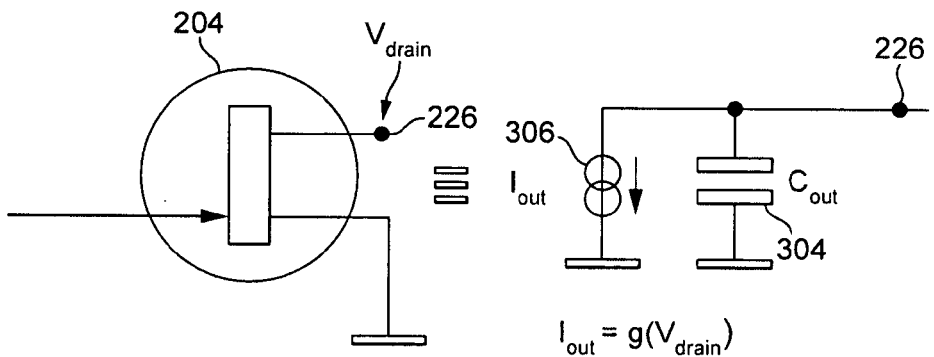

FIG. 3b shows an alternative topology where the shunt resistance 302 of FIG. 3a is replaced with a voltage dependent current source 306.

FIGS. 3a and 3b each illustrate a simplified output equivalent circuit for the RF power amplifier active element. That is, they represent the load the envelope tracking power amplifier presents, when running, at baseband frequencies to the matching and drain feed network. This is not necessarily the same as the impedance which would be seen (or exhibited) looking into the output node (or pin) 226 with an RF network analyser. The capacitor 304 is the transistor output capacitance, and may include the capacitance due to the active device itself, bond pad capacitance, and package capacitance. The model, in FIG. 3a, of a resistor in parallel with a capacitor is simple, but provides a good approximation of the baseband load which the transistor presents to the matching and drain feed network, and thence to the power supply.

It can be noted that in an envelope tracking system, an RF amplifier is fed with a modulated RF drive signal on line 228, and is powered from a time-varying power supply on line 230. The power supply is arranged to follow the RF envelope. The shaping function 104 controls the relationship between supply voltage and RF power. When the RF amplifier is running, it draws a supply current from the power supply. Since the RF drive and the supply voltage are varying with time, the supply current will also be time varying. Assuming that the RF amplifier has RF decoupling inside, the current flowing from the modulator 102 into the power amplifier via line 230 will be varying at the modulation rate, e.g. 0-20 MHz, rather than the RF frequency.

The invention and its embodiments is directed at compensating for a baseband effect which occurs in the RF tuning and matching components in the RF amplifier. As the supply voltage and supply current can be varying at up to 20 MHz or so, voltage drops occur between the supply feed line 230 and the active device prior art node 226. At a particular time instant, the goal is to apply a particular supply voltage to the active device. The supply voltage to the amplifier is therefore—in accordance with the invention—pre-distorted so that, after this time-varying voltage has passed through the drain feed and power amplifier network, the correct voltage is delivered at node 226.

The embodiments of the present invention provide for the supply voltage delivered to the output power amplifier at node 231 to be pre-distorted to take into account the distortion effects caused by the components within the amplifier 114 itself before the supply voltage is applied at node 226. In this way, the invention operates toward an objective of delivering a tracked supply voltage at the drain of the active element 204, at node 226, which is aligned to the input signal to be amplified on line 228. Thus the embodiments of the invention seek to address the distortion caused by the elements within the amplifier 114 which modify the voltage delivered at node 230 such that the supply voltage delivered to the active device at node 226 is not a faithful copy of the voltage delivered at node 230.

The transistor supply voltage at node 226, denoted as $V_{drain}$ in FIGS. 2 and 3, and the RF drive signal into the transistor at node 235 are related via the shaping table within the shaping function 104.

In the following analysis, it is assumed that the capacitance of the capacitor 304 of FIGS. 3a and 3b is independent of the transistor supply voltage $V_{drain}$ on line 226, and remains a constant value. This assumption is made for simplicity, and ease of explanation. The mathematics can easily be extended to make the capacitance value vary with voltage. This is more realistic for active devices fabricated in certain semiconductor technologies.

Figure 4:
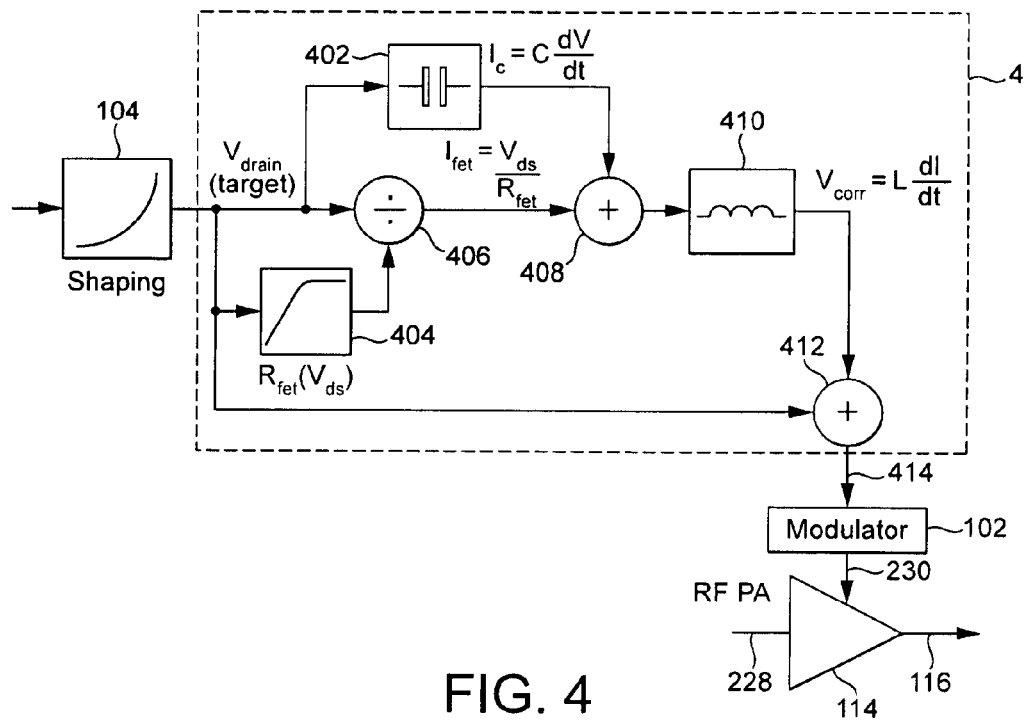
FIG. 4 illustrates a modification to an envelope tracked power supply in accordance with a first embodiment of the invention.

With reference to FIG. 4, there is shown the implementation of a pre-distortion technique in accordance with a first embodiment of the invention.

A pre-distortion block 400 in accordance with the first embodiment is located between the shaping function 104 and the modulator 102. The pre-distortion block 400 includes a mapping function 404, a capacitor 402, an inductor 410, a divider 406, a combiner 408, and a combiner 412.

The pre-distortion block 400 receives the output of the shaping function 104 as its input, and generates the input to the modulator 102 on a line 414. The modulator 102 then generates the supply voltage line 230 to the amplifier 114.

The output of the shaping function 104 provides a target drain voltage, i.e. the desired drain voltage to be applied at the node 226.

In the pre-distortion block 400 of FIG. 4, pre-distortion is applied to take into account the effect on the supply voltage between nodes 231 and 226 of the resistance of the resistor 302 of FIG. 3a, the capacitance of the capacitor 210 of FIG. 2a, and the inductance of the inductor 216 of FIG. 2a. This is now further explained with reference to FIG. 4.

Figure 6:
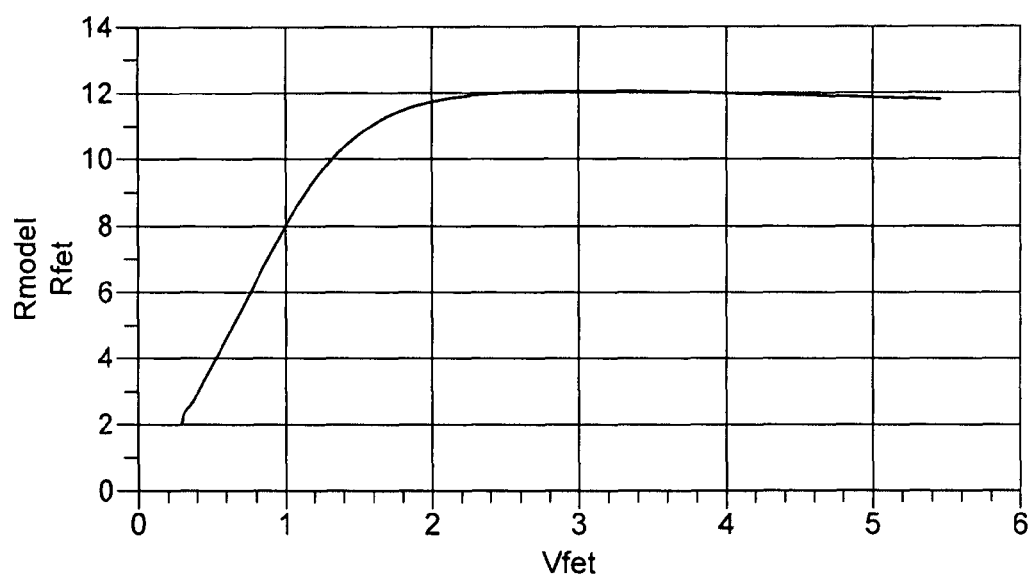
FIG. 6 illustrates a mapping function in accordance with an implementation of a preferred embodiment of the invention.

The mapping function 404 includes a mapping table which is formed based on pre-characterisation of the active device 204 as illustrated in FIG. 6. The pre-characterisation of the active device 204, with reference to the model of FIG. 3a, establishes the relationship between the value of the resistor 302 for a given drain voltage $V_{drain}$ at node 226. As can be seen, the resistance of the resistor 302 (denoted $R_{fet}$ in FIG. 6) varies in a predetermined way in accordance with variation of the drain voltage (denoted by $V_{fet}$ in FIG. 6) at node 226. Thus, with reference to FIG. 4, the mapping function 404 provides a resistor value at its output in accordance with the target drain voltage value at its input provided by the shaping function 104.

The target drain voltage is also provided as one input to the divider 406, and the resistor value from the mapping table 404 is provided as the other input to the divider 406. The divider 406 thus divides the target drain voltage by the associated resistor value to generate a current value, which is representative of the baseband current in the active device of the amplifier, and hence also the baseband current in the transistor 204 for the given target drain voltage value. This current is provided as a first input to the combiner 408.

The target drain voltage is also provided as an input to the capacitor block 402. The capacitor function 402 takes the capacitance values of the device output capacitance 304 of the model of FIG. 3a, and the capacitance of the matching capacitor 210 of the model of FIG. 2a, and sums them, to provide a capacitance value C. The small current in the capacitors depends on the rate of change of $V_{drain}$. The capacitor function determines a current value $I_C$ associated with these capacitors, in dependence upon the rate of change of the drain voltage. This current value $I_C$ then provides a second input to the combiner 408.

The combiner 408 thus combines the current associated with the capacitors 304 and 210 with the current associated with the transistor 204, and provides the combined current to the inductor function 410.

This combined current represents the current flowing in the inductor 216.

The inductor function 410 then generates a correction voltage, denoted $V_{corr}$, in dependence upon the known inductor value L of the inductor 216 and the rate of change of current through an inductor having such a value (which current is supplied from the combiner 408).

This correction voltage $V_{corr}$ is provided as a first input to the combiner 412, which receives as its other input the target drain voltage, such that the correction voltage $V_{corr}$ add to the target drain voltage to provide a voltage on line 414 which is pre-distorted to take into account the effects of the components within the amplifier.

In general terms, the pre-distortion block thus applies pre-compensation to the supply voltage delivered to the supply terminal of the amplifier, which compensates for the effects on the supply voltage between the supply terminal of the amplifier and the point (or node) at which it is delivered to the supply node of the active amplifier element of the amplifier.

The pre-distortion function may compensate for some or all of the effects of the components in the amplifier. The more effects are compensated for, the greater the improvement achieved. However compensating for one effect still offers some improvement. Compensating for the supply feed inductance offers the single greatest improvement in most implementations.

The exemplary pre-distortion technique of FIG. 4 compensates for circuit elements as illustrated in FIG. 2a, relying upon the model of the active element as shown in FIG. 3a. Of course many variations will exist depending upon the particular amplifier circuit and the model used. For example the model 208 of FIG. 2b, for the transmission line of FIG. 2a, may be utilised to further improve the pre-distortion arrangement of FIG. 4, to introduce compensation for the transmission line. The pre-distortion technique of FIG. 4 utilises the model of the active element 204 illustrated in FIG. 3a, generating the current flowing in the inductor 216 using the blocks 404 and 406. Alternatively this current may be estimated in dependence on the model of the active element shown in FIG. 3b, replacing the blocks 404 and 406 with a mapping table which generates a current value directly in dependence upon the target voltage.

Thus using the model of FIG. 3a, the drain current of the transistor can be determined as $I_{drain}=V_{drain}/R_{out}=V_{drain}/f(V_{drain})$, where $R_{out}=f(V_{drain})$; i.e. $R_{out}$ is a function of $V_{drain}$. Using the model of FIG. 3b, alternatively, $I_{drain}=g(V_{drain})=V_{drain}/f(V_{drain})$. Thus FIG. 3b provides an alternate way of determining the current in the active element. In practice, the relationship between $V_{drain}$ and $I_{drain}$ in envelope tracking operation would be established by measurement and/or simulation. From these results, one would derive the functions $f(V_{drain})$ or $g(V_{drain})$. Deriving one function readily leads to the other. The pre-distortion equation may then be generated taking the time-varying target $V_{drain}$ voltage and generating the required power amplifier supply voltage 230.

The arrangement of FIG. 4 incorporates a feed forward approach.

Figure 5:
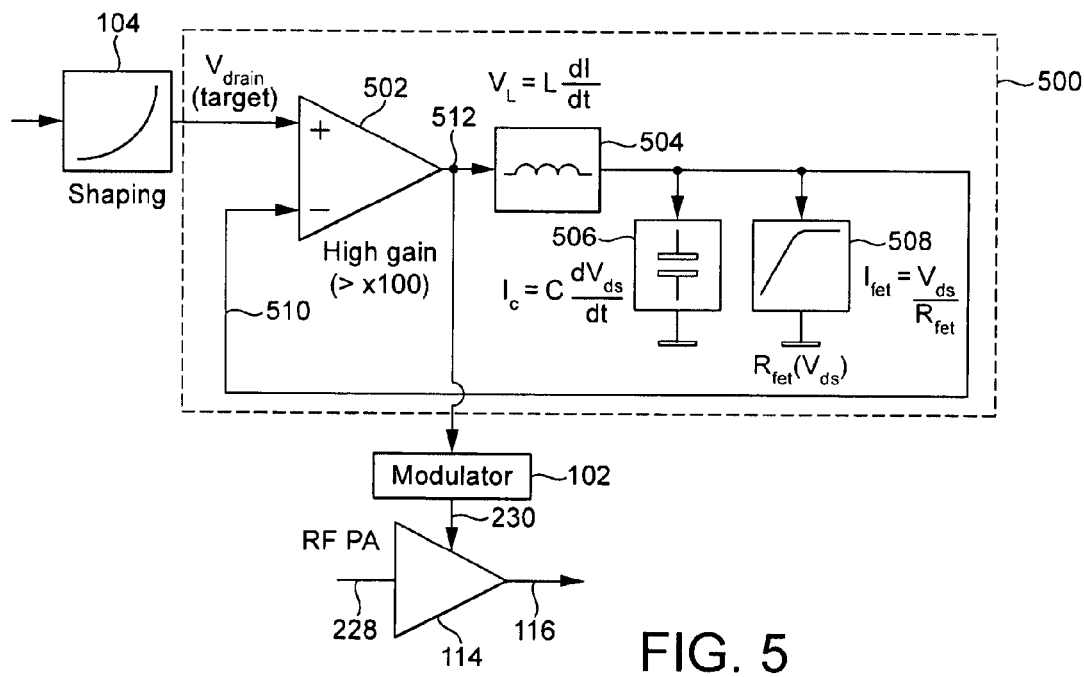
FIG. 5 illustrates a modification to an envelope tracked power supply in accordance with a second embodiment of the invention.

With reference to FIG. 5, there is illustrated a second embodiment in accordance with the invention. The arrangement of FIG. 5 incorporates a feedback approach.

In the second embodiment, a pre-distortion block 500 includes a difference amplifier 502, an inductor function 504, a capacitor function 506, and a resistor function 508. In general, the capacitor function 506 corresponds to the capacitor function 402 of FIG. 4, the resistor function 508 corresponds to the resistor function 404 of FIG. 4, and the inductor function 504 corresponds to the inductor function 410 of FIG. 4.

The corrected voltage $V_{corr}$ is generated on a line 510, and fed back to a difference input of the difference amplifier 502. The other input of the difference amplifier is provided by the target drain voltage. The output of the difference amplifier 502 provides the target drain voltage adjusted by the corrected voltage $V_{corr}$, such that the voltage at the input of the modulator 102 is appropriately pre-distorted.

The feedback approach of FIG. 5 uses a closed loop which forces the voltage across the transistor element 204, to follow the target supply voltage $V_{drain}$ provided by the shaping function 104. The required pre-distorted supply voltage is present at the output of the differential amplifier 502 at node 512, and this voltage is fed to the modulator 102. In principle, the pre-distortion function could alternatively be implemented at the output of the modulator.

The present invention has been described herein by way of reference to particular preferred embodiments. However the invention is not limited to such embodiments. The present invention has particular applications in relation to RF amplifiers, but is not limited to such implementations. The invention can be advantageously utilised in any environment where a tracked supply signal should be preferably aligned with an input signal.

The described preferred embodiments utilising an RF amplifier are not limited to any particular load being driven by such RF amplifier. However it is envisaged that such an RF amplifier will typically drive an antenna. As such the present invention has particular advantageous uses in the field of communications, including the field of mobile communications, and particularly in the field of mobile communication handsets.

The invention claimed is:

1. A method of generating a supply voltage for a power amplifier arranged to amplify an input signal, comprising:
   generating a target supply voltage tracking the input signal;
   pre-distorting the target supply voltage to compensate for the effects applied to the supply voltage between an input terminal of the amplifier and a node of an active element of the amplifier to which the modulated supply voltage is applied; and
   generating the supply voltage for the amplifier in dependence on the pre-distorted target supply voltage.

2. The method according to claim 1 wherein the step of pre-distorting compensates for the effects of at least one capacitor in the supply feed network of the amplifier.

3. The method according to claim 1 wherein the step of pre-distorting compensates for shunt capacitance presented by the active element of the amplifier.

4. The method of claim 1 wherein the step of generating the target supply voltage comprises generating an envelope signal representing the envelope of the signal to be amplified.

5. The method of claim 4 wherein the step of generating the target supply voltage comprises shaping the generated envelope signal.

6. The method of claim 4 wherein the step of generating the target supply voltage comprises modulating the generated envelope signal.

7. The method of claim 1 wherein the step of generating the supply voltage comprises modulating the pre-distorted target supply voltage.

8. A supply voltage stage for a power amplifier arranged to amplify an input signal, comprising:
   a tracking voltage generator for generating a target supply voltage tracking the input signal;
   a pre-distortion stage for pre-distorting the target supply voltage to compensate for effects on a supply voltage in the amplifier, wherein the supply voltage for the amplifier is connected at a supply voltage terminal of the amplifier, the pre-distortion stage being configured to compensate for any effect on the supply voltage in the amplifier path between the supply voltage terminal and an active element of the amplifier which provides the amplification of the input signal; and
   a supply voltage generator for generating the supply voltage for the amplifier in dependence on the pre-distorted target supply voltage.

9. The supply voltage stage of claim 8 wherein the active element is a transistor, and the amplifier path is between the supply voltage terminal of the amplifier and a supply mode of the transistor.

10. The supply voltage stage of claim 9 wherein the amplifier path attenuates or delays the supply voltage delivered to the active element.

* * * * *